United States Patent
Burton et al.

(10) Patent No.: US 7,449,966 B2
(45) Date of Patent: Nov. 11, 2008

(54) METHOD AND AN APPARATUS TO SENSE SUPPLY VOLTAGE

(75) Inventors: Edward A. Burton, Hillsboro, OR (US);
Robert J. Greiner, Beaverton, OR (US);
Anant S. Deval, Beaverton, OR (US);
Douglas R. Huard, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 101 days.

(21) Appl. No.: 11/431,256

(22) Filed: May 9, 2006

(65) Prior Publication Data
US 2007/0273450 A1    Nov. 29, 2007

(51) Int. Cl.
*H03B 27/00* (2006.01)

(52) U.S. Cl. .................. 331/57; 331/74; 331/185; 324/123; 374/170

(58) Field of Classification Search .......... 331/57, 331/185, 74; 324/123; 374/170
See application file for complete search history.

(56) References Cited

U.S. PATENT DOCUMENTS

| | | | |
|---|---|---|---|
| 6,954,054 B2 | 10/2005 | Brown | |
| 6,977,488 B1 | 12/2005 | Nogawa et al. | |
| 7,027,944 B2 | 4/2006 | Tabaian et al. | |
| 7,123,104 B2* | 10/2006 | Bostak et al. | 331/57 |
| 7,215,108 B2 | 5/2007 | Inn et al. | |
| 7,221,130 B2 | 5/2007 | Ribeiro et al. | |
| 7,292,016 B2 | 11/2007 | Wake | |
| 2006/0145678 A1 | 7/2006 | Ribeiro et al. | |
| 2007/0266262 A1 | 11/2007 | Burton et al. | |

OTHER PUBLICATIONS

Huang, et al., "A Scalable Multiphase Buck Converter with Average Cuttent Share Bus,"International IGR Rectifier, APEC 2003, 7 pages.
Zhang, Michael T., "Powering Intel Pentium 4 Generation Processors," 2001 IEEE, pp. 215-218.

* cited by examiner

*Primary Examiner*—Arnold Kinkead
(74) *Attorney, Agent, or Firm*—Blakely, Sokoloff, Taylor & Zafman LLP

(57) ABSTRACT

A method and an apparatus to sense supply voltage have been disclosed. In one embodiment, the apparatus includes a resistor having a first end and a second end, the first end coupled to a voltage supply and a ring oscillator sensor coupled between the second end of the resistor and ground, the ring oscillator sensor having an output coupled to a computational element. Other embodiments have been claimed and described.

23 Claims, 6 Drawing Sheets

METHOD AND AN APPARATUS TO SENSE SUPPLY VOLTAGE

TECHNICAL FIELD

This Application is related to co-pending U.S. patent application Ser. No. 11/431,739, entitled "CURRENT DETECTION FOR MICROELECTRONIC DEVICES USING SOURCE SWITCHED SENSORS," filed May 9, 2006, and co-pending U.S. patent application Ser. No. 11/432,869, entitled "I/O BUS FOR AN ANALOG SENSOR IN AN INTEGRATED CIRCUIT," filed May 9, 2006.

Embodiments of the invention relate generally to semiconductor circuits, and more particularly, to sensing supply voltage.

BACKGROUND

Modern integrated circuit (IC) processes for implementing high-end processors and other complex ICs usually accommodate input voltages in a very restricted voltage range. For example, one conventional maximum operating range from minus 500 mV to positive 1.3V is typical for many ICs. Such ICs may use a special circuit to sense a voltage that ranges between a volt and a few tens of volts. Without a circuit to compress the voltage range of such a large-signal input, the IC may suffer from irreparable harm.

Conventionally, this range compression may often be accomplished with a resistive voltage divider. For example, by using a 30:1 ratio, the range can be compressed by a factor of 1/30. FIG. 1 shows one conventional supply voltage sensor 100 using a resistive voltage divider 110. The signal at the middle node 112 of the divider 110 is sensed and digitized by the sensor/digitizer 130, which may include an analog to digital converter. An output of the sensor/digitizer 130 is digitally gained back up by digitally multiplying by 30 using the multiplier circuit 120.

However, several challenges make it difficult to successfully implement the supply voltage sensor 100. First, the supply voltage sensor 100 typically needs a very high impedance compared to that of the resistive divider 110, which is a significant challenge when the divider 110 itself needs to operate on very low power, which implies a high impedance for the divider. Second, the sensor/digitizer 130 needs good linearity from tens of milli-volts up to about a volt. Such circuits can be designed, but usually such circuits rely on precision resistors, high value resistors, precision capacitors, inductors, wellmatched transistors, low leakage transistors, or other analog circuit elements that are generally not available on a process targeting digital logic. Conventional processors found in many of today's computing systems are generally implemented on a digital logic process with an inferior set of analog devices.

DESCRIPTION OF THE DRAWINGS

Embodiments of the present invention is illustrated by way of example and not limitation in the figures of the accompanying drawings, in which like references indicate similar elements and in which.

DETAILED DESCRIPTION

A method and an apparatus to sense supply voltage are disclosed. In the following detailed description, numerous specific details are set forth in order to provide a thorough understanding. However, it will be apparent to one of ordinary skill in the art that these specific details need not be used to practice some embodiments of the present invention. In other circumstances, well-known structures, materials, circuits, processes, and interfaces have not been shown or described in detail in order not to unnecessarily obscure the description.

Reference in this specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Figure 1:
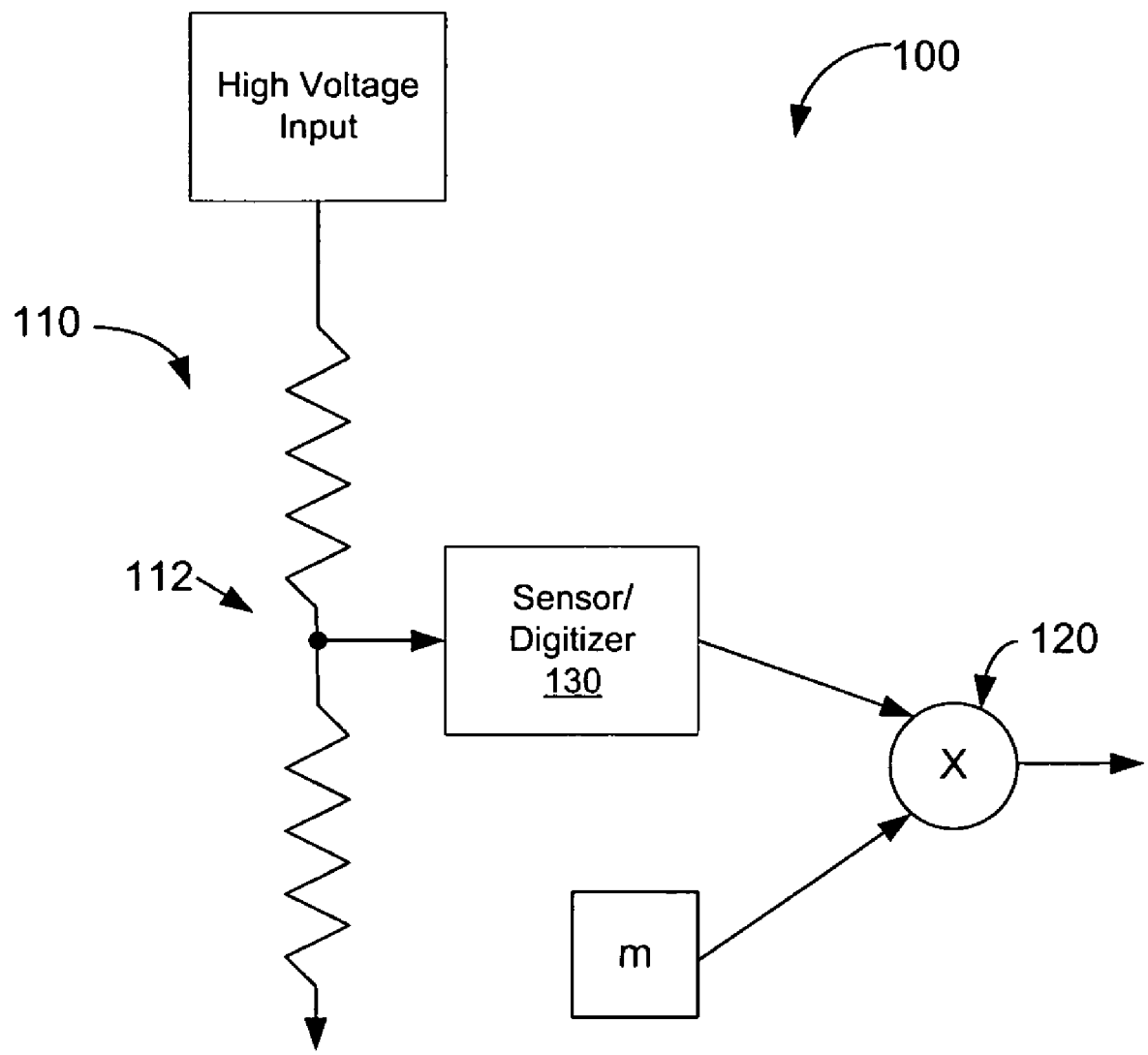
FIG. 1 shows a conventional supply voltage sensor.
Figure 2:
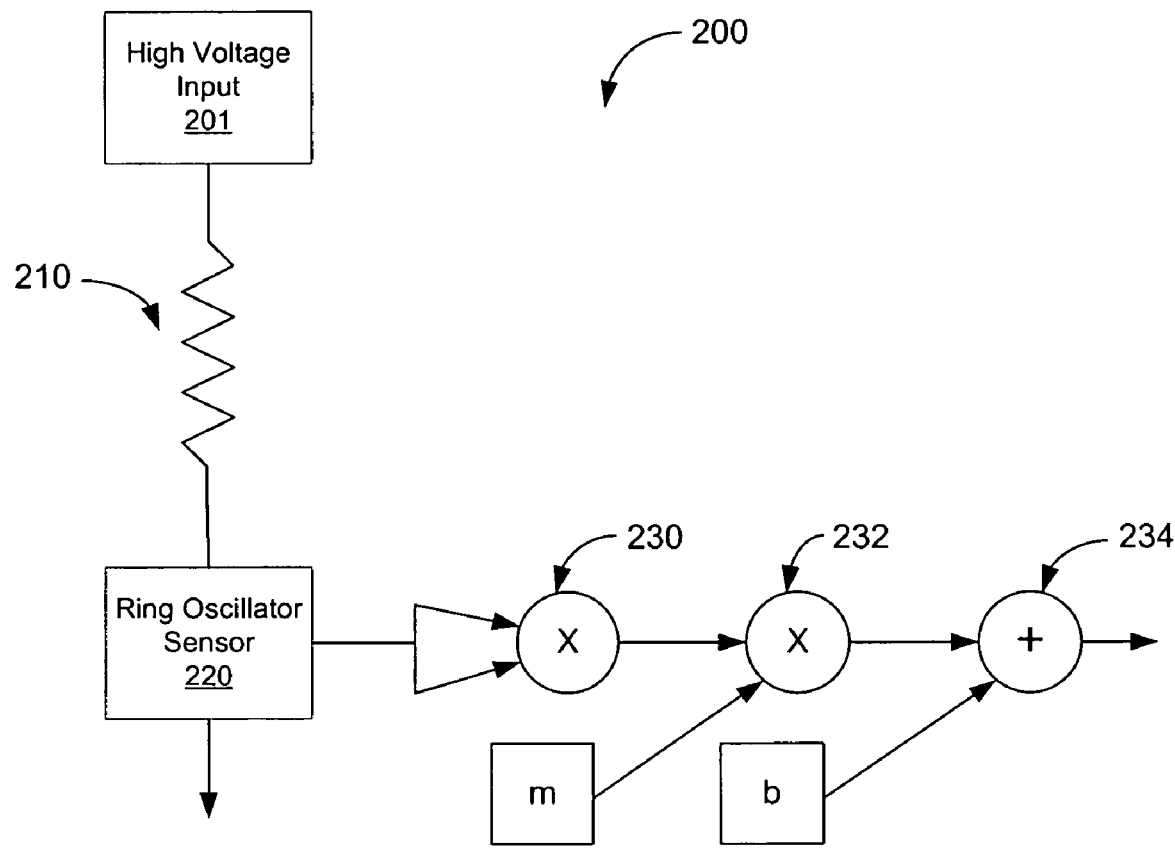
FIG. 2 shows one embodiment of a supply voltage sensor.

FIG. 2 shows one embodiment of a supply voltage sensor in a computing system. The supply voltage sensor 200 may be usable with a voltage regulator (e.g., a synchronous buck regulator) in a computing system to sense the supply voltage to the point-of-load voltage regulator, which supplies voltage to the processor cores in the computing system. The supply voltage sensor 200 includes a resistor 210, a ring oscillator sensor 220, a first multiplier circuit 230, a second multiplier circuit 232, and an adder 234. The first and second multiplier circuits 230 and 232 and the adder 234 may be parts of a microcontroller coupled to the ring oscillator sensor 220. Alternatively, a single multiplier circuit may be used instead of the first and second multiplier circuits 230 and 232. The single multiplier circuit may be time-sliced to perform the functions performed by the first and second multiplier circuits 230 and 232. The resistor 210 may reside on a common substrate with the ring oscillator sensor 220. Alternatively, the resistor 210 may be external to the chip on which the ring oscillator sensor 220 is built.

The supply voltage sensor 200 receives a high voltage input 201 at one end of the resistor 210. A second end of the resistor 210 is coupled to the ring oscillator sensor 220. An output of the ring oscillator sensor 220 is coupled to the first multiplier circuit 230. An output of the first multiplier circuit 230 is coupled to an input of the second multiplier circuit 232. An output of the second multiplier circuit 232 is coupled to an input of the adder 234. More detail of one embodiment of the ring oscillator sensor 220 are discussed below with reference to FIG. 3A.

In one embodiment, the input supply voltage 201 is shifted down by the resistor 210 and the shifted down voltage is input to the ring oscillator sensor 220. In other words, the input supply voltage 201 is divided over the resistor 210 and the ring oscillator sensor 220. The ring oscillator sensor 220 senses the shifted down voltage. In some embodiments, the ring oscillator sensor 220 digitizes the shifted down voltage to prepare the shifted down voltage for post-processing by the multipliers 230 and 232, as well as the adder 234. Since the impedance of the ring oscillator sensor 220 is non-linear, the output signal from the ring oscillator sensor 220 is squared by the first multiplier circuit 230 and then multiplied with a first predetermined value m by the second multiplier circuit 232. Alternatively, a single multiplier circuit may be time-sliced to perform both the squaring operation and the multiplication. After squaring and multiplying the output signal from the ring oscillator sensor 220, the adder 234 adds a predetermined constant b to the result. The predetermined value m and the predetermined constant b are derived by evaluating the impedance of the ring oscillator sensor 220. As mentioned above, the impedance of the ring oscillator sensor 220 is non-linear. Thus, the output signal from the ring oscillator sensor 220 has to be post-processed according to the following equation:

$$Y=mx^2+b,$$

where x represents the output signal from the ring oscillator sensor 220, m corresponds to the predetermined value input to the second multiplier circuit 232, and b corresponds to the predetermined constant input to the adder 234.

In some embodiments, the voltage sensor 200 senses voltage ranging from a few volts to about twenty-five volts. Although post-processing operations are performed on the output signal from the ring oscillator sensor 220 using the multipliers 230 and 232 and the adder 234, resources from a microcontroller of a power block in the computing system may be leveraged to perform these operations. More details of one embodiment of the power block are discussed below with reference to FIG. 5.

Figure 3A:
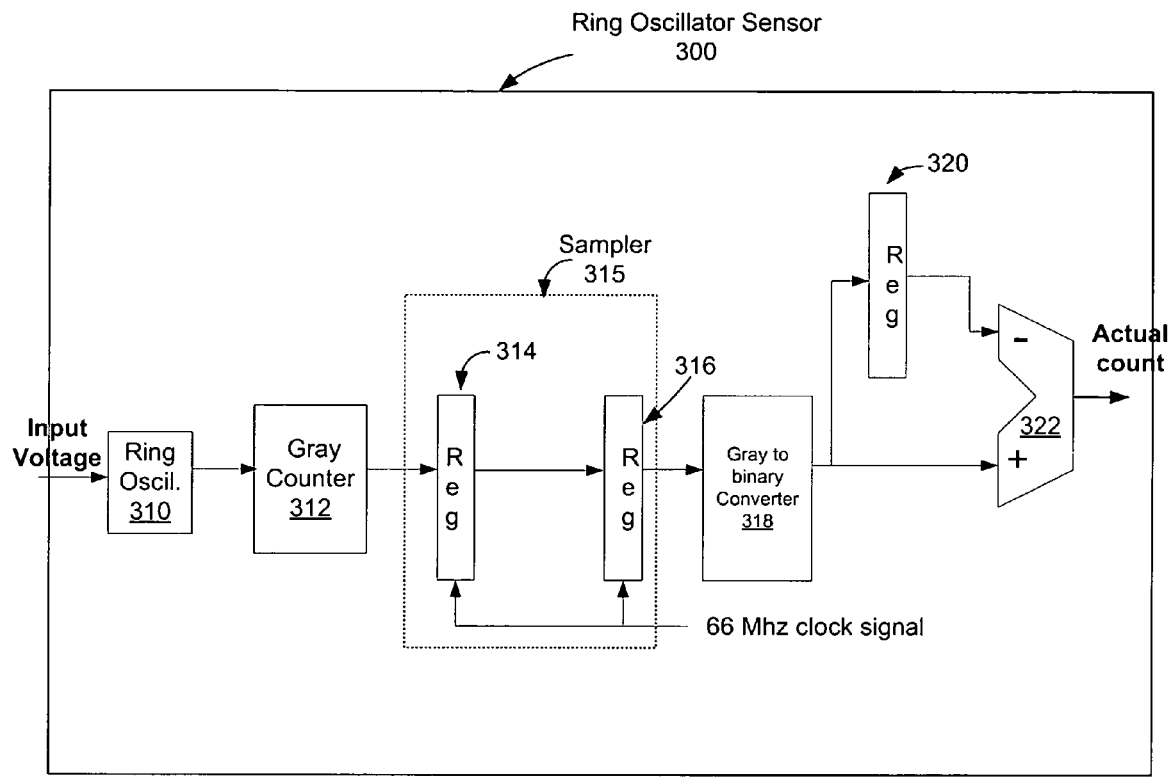
FIG. 3A shows one embodiment of a ring oscillator sensor.
Figure 3B:
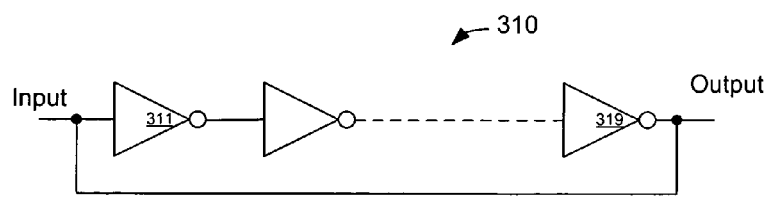
FIG. 3B shows one embodiment of a ring oscillator.

FIG. 3A illustrates one embodiment of a ring oscillator sensor. The ring oscillator sensor 300 includes a ring oscillator 310, a Gray counter 312, a sampler 315, a gray to binary converter 318, a third register 320, and a subtractor 322. The sampler 315 may include a first register 314 and a second register 316 coupled in series. In some embodiments, registers 314, 316, and 320 are implemented with rising edge triggered flops. An illustrative embodiment of the ring oscillator 310 is shown in FIG. 3B. Referring to FIG. 3B, the ring oscillator 310 includes a number of inverters, such as 311 and 319. The inverters are coupled to each other in series and the output of the last inverter 319 in the series is fed back to the input of the first inverter 311 in the series.

Referring back to FIG. 3A, an output of the ring oscillator 310 is coupled to an input of the counter 312. An output of the counter 312 is coupled to an input of the first register 314. An output of the first register 314 is coupled to an input of the second register 316. An output of the second register 316 is coupled to an input of the gray to binary converter 318. An output of the Gray-to-binary converter 318 is coupled to an input of the third register 320 and a positive terminal of the subtractor 322. An output of the third register 320 is coupled to a negative terminal of the subtractor 322.

In some embodiments, the ring oscillator 310 receives an input voltage, which is a shift down version of an input supply voltage from a resistor coupled to a source of the input supply voltage, such as the resistor 210 in FIG. 2. As the input voltage propagates through the series of inverters in the ring oscillator 310, the last inverter in the series of inverters outputs a clock signal having a frequency related to the delay of the inverters. As the input supply voltage changes, the delay of the inverters changes accordingly. Thus, the frequency of the output clock signal also changes in response to changes in the input supply voltage. In other words, the frequency of the output clock signal from the ring oscillator 310 is related to the input supply voltage.

To digitize the output clock signal from the ring oscillator 310, the following operations may be performed. The Gray counter 312 may count in response to the output clock signal from the ring oscillator 310. Note that the Gray counter 312 counts by changing one bit at a time, unlike binary counters. For example, a two-bit Gray counter counts from "00" to "01," and then to "11," and then to "10," and then back to "00." Thus, even if the count from the Gray counter 312 is sampled when the count is not settled, only one bit in the count may not be determined while the remaining bits may be determined. As a result, the count from the Gray counter 312 may be sampled accurately as described below.

In one embodiment, the count from the Gray counter 312 is sampled using two registers. The count is input to the first register 314. Moreover, to allow the count to settle, additional time is provided by sending the output of the first register 314 to the second register 316. Both registers 314 and 316 may be clocked at a substantially constant frequency, such as 66 MHz. When the first register 314 samples the count, one of the bits may not be settled yet. The second register 316 samples the count again when the unsettled bit is settled to either a logic "1" or a logic "0" and provides the sampled count to the Gray-to-binary converter 318. The Gray-to-binary converter 318 converts the sampled count into a binary count and outputs the binary count to the subtractor 322 and the third register 320. As such, the third register 320 holds a previous value of the converted binary count from the Gray-to-binary converter 318. To derive the actual count, the subtractor 322 subtracts the previous value of the binary count from the current binary count. As such, the output clock signal from the ring oscillator 310 is converted by the above operations into a digital value ready for post-processing by digital signal processing circuits, such as the multipliers 230 and 232 and the adder 234 in FIG. 2.

Figure 4:
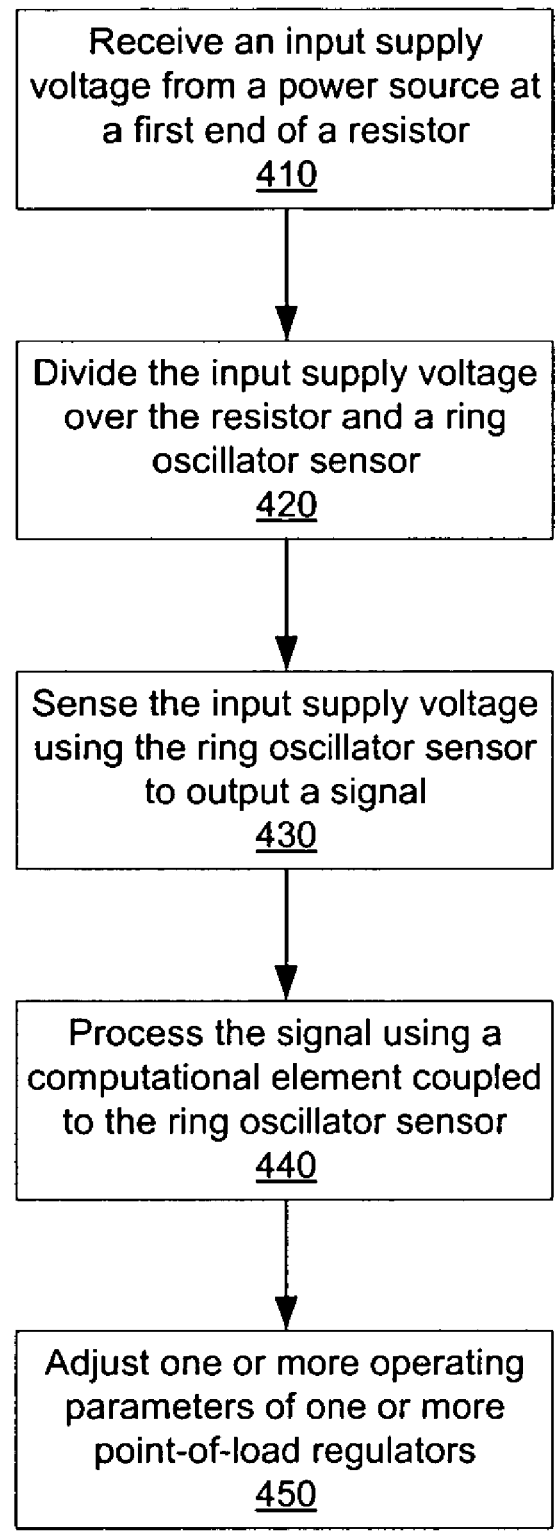
FIG. 4 illustrates one embodiment of a process to sense supply voltage.

FIG. 4 shows one embodiment of a process to sense a supply voltage used as a remote power source for the point-of-load voltage regulator for one or more processor cores. The process is performed by processing logic that may comprise hardware (e.g., circuitry, dedicated logic, etc.), software (such as a program operable to run on a general-purpose computer system or a dedicated machine), or a combination of both.

In one embodiment, processing logic receives an input supply voltage at a first end of a resistor (processing block 410). Processing logic divides the input supply voltage over the resistor and a ring oscillator sensor (processing block 420). The ring oscillator sensor may be coupled to the resistor in series. However, unlike resistors in a conventional resistive voltage dividers, the impedance of the ring oscillator sensor may be non-linear. Furthermore, the resistor and the ring oscillator sensor may or may not reside on a common IC substrate. When the resistor does not reside on a common IC substrate with the ring oscillator, the resistor may be referred to as an off-chip resistor. In some embodiments, the ring oscillator sensor resides on a common IC substrate with the processor cores.

Using the ring oscillator sensor, processing logic senses the input supply voltage to output a signal (processing block 430). Then processing logic may process the signal using a computational element (which may be found in a microcontroller) coupled to the ring oscillator sensor (processing block 440). Since the impedance of the ring oscillator sensor is non-linear, processing logic may operate on the signal according to the following equation:

$$Y=mx^2+b,$$

where x represents the signal from the ring oscillator sensor, m and b are predetermined constants related to the impedance of the ring oscillator sensor. For instance, processing logic may use a multiplier circuit in the computational element in a time-sliced fashion to square the signal and to multiply the signal with the first predetermined constant, m, and then use an adder in the computational element to add the second predetermined constant, b, to the result.

In response to the processed signal, processing logic may adjust the operating parameters of the point-of-load regulator or regulators (processing block 450). Thus, the point-of-load regulators may reduce or avoid noise and stability issues associated with variations of the input supply voltage. As a result, the output of the point-of-load voltage regulators may be regulated such that the input supply voltage may be maintained below a predetermined maximum value. As such, ICs (e.g., processor cores) powered by the input supply voltage may be protected from excessively high supply voltages.

Figure 5:
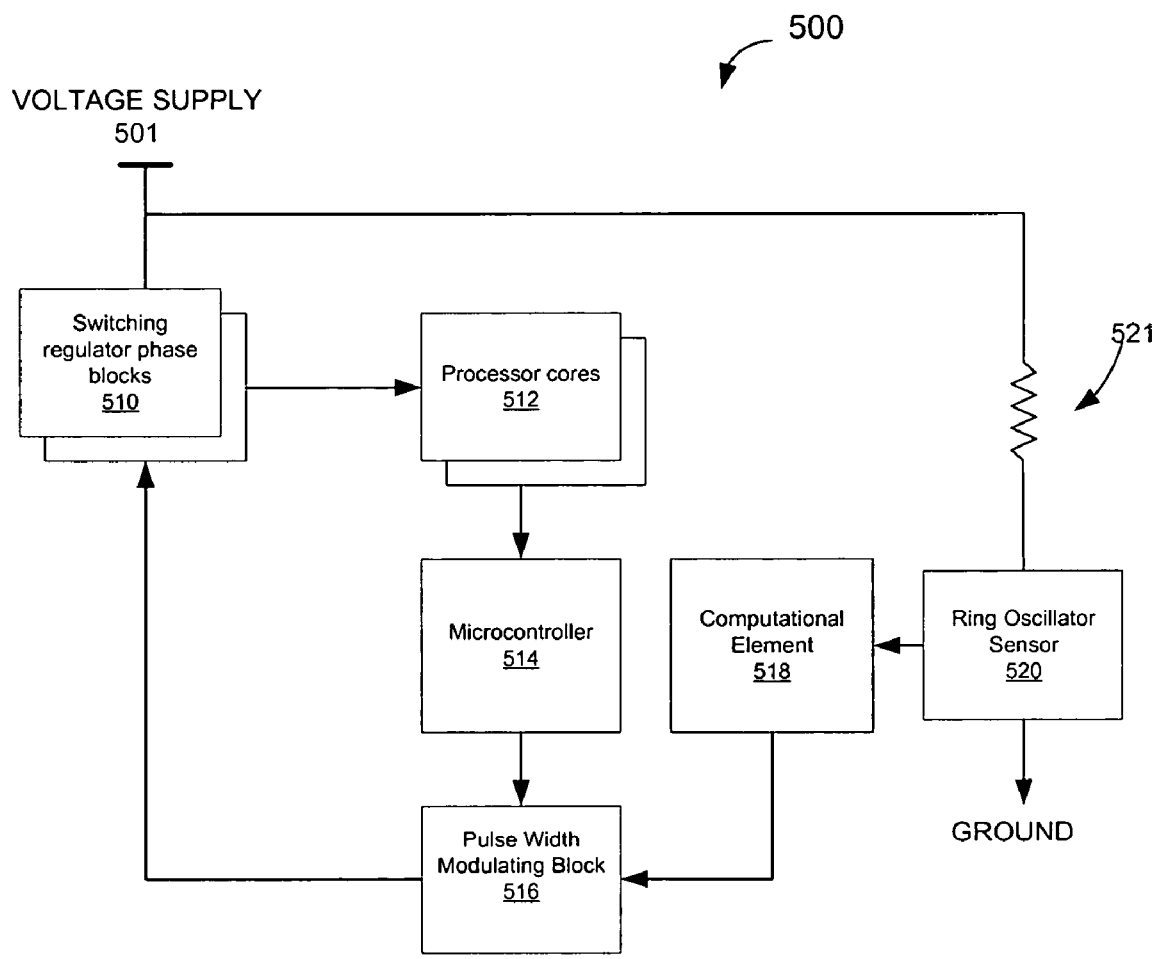
FIG. 5 illustrates one embodiment of a power block in a computing system having a supply-voltage feed forward circuit.

FIG. 5 illustrates one embodiment of a power block in a computing system. The power block 500 includes one or more switching regulator phase blocks 510, one or more processor cores 512, a microcontroller 514, a pulse width modulating block 516, a computational element 518, a resistor 521, and a ring oscillator sensor 520. In some embodiments, one or more of the above components may be parts of a power delivery network to produce one or more voltage levels. Furthermore, the power delivery network may include more components, such as inductors, capacitors, field effect transistors, etc.

The microcontroller 514 is a digital processor device, which may include one or more general-purpose processing devices. Alternatively, the microcontroller 514 may include one or more special-purpose processing devices such as a digital signal processor (DSP), an application specific integrated circuit (ASIC), a field programmable gate array (FPGA), or the like. The microcontroller 514 may also include any combination of a general-purpose processing device and a special-purpose processing device.

Note that any or all of the components and the associated hardware illustrated in FIG. 5 may be used in various embodiments of the power block 500. However, it should be appreciated that other configurations of the power block may include one or more additional devices not shown in FIG. 5.

In one embodiment, the switching regulator phase blocks 510 receive an input voltage from the voltage supply 501. Although the input voltage may fluctuate from time to time, the switching regulator phase blocks 510 adjust the input voltage to provide a substantially stable voltage to the processor cores 512. Each of the switching regulator phase blocks 510 may correspond to a phase of the supply voltage. In some embodiments, there are two switching regulator phase blocks 510, and thus, there are two phases of the supply voltage 501 output to the processor cores 512. It should be appreciated that there may be different numbers of switching regulator phase blocks in different embodiments to generate different numbers of phases (e.g., 4, 8, etc.). Furthermore, each of the switching regulator phase blocks 510 may be substantially identical to each other.

The processor cores 512 are the central processing units of the computing system. The processor cores 512 are powered by the regulated voltage from the switching regulator phase blocks 510. The processor cores 512 may send output signals to the microcontroller 514, which also receives input from the ring oscillator sensor 520.

The ring oscillator sensor 520 is coupled to the voltage supply 501 via the resistor 521. In one embodiment, the resistor 521 is external to the chip on which the other illustrated components (e.g., the processor cores 512, the ring oscillator sensor 520, etc.) reside. Alternatively, the resistor 521 may reside on a common IC substrate with the other components illustrated in FIG. 5. The resistor 521 and the ring oscillator sensor 520 divide the voltage supply 501 into a first voltage across the resistor 521 and a second voltage across the ring oscillator sensor 520. The ring oscillator sensor 520 senses the second voltage. The ring oscillator sensor 520 digitizes the input voltage to generate an output signal, which is input to the computational element 518. The computational element 518 may include circuits, such as a multiplier, an adder, etc., to further process the signal from the ring oscillator sensor 520. Then the computational element 518 provides the processed signal to the pulse width modulating block 516. Alternatively, the ring oscillator sensor 520 may send the output signal to the microcontroller 514 to be processed and the microcontroller 514 may output the processed signal to the pulse width modulating block 516. Based on the processed signal, the pulse width modulating block 516 varies a pulse width of an output signal from the pulse width modulating block 516. The output signal from the pulse width modulating block 516 is provided to the switching regulator phase blocks 510 as a feedback such that the switching regulator phase blocks 510 may adjust the input voltage from the voltage supply 501 accordingly in order to output a substantially constant voltage to power the processor cores 512.

Figure 6:
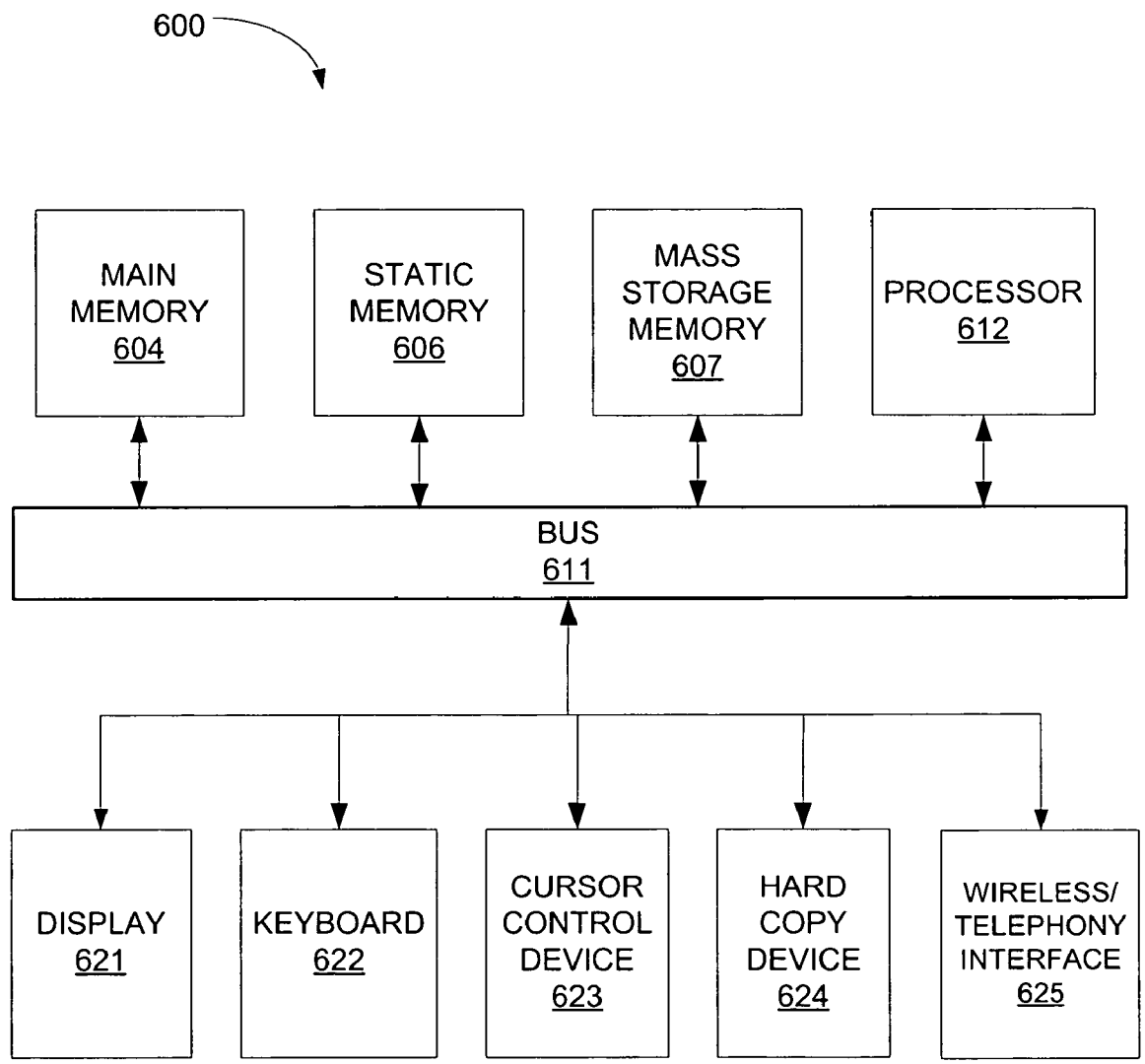
FIG. 6 illustrates an exemplary embodiment of a computing system.

FIG. 6 shows an exemplary embodiment of a computer system 600 usable with some embodiments of the invention. Computer system 600 includes a communication mechanism or bus 611 for communicating information, and a processor 612 coupled with bus 611 for processing information. Processor 612 includes one or more processor cores.

Computer system 600 further includes a random access memory (RAM), or other dynamic storage device 604 (referred to as main memory) coupled to bus 611 for storing information and instructions to be executed by processor 612. Main memory 604 also may be used for storing temporary variables or other intermediate information during execution of instructions by processor 612.

Computer system 600 also includes a read only memory (ROM) and/or other static storage device 606 coupled to bus 611 for storing static information and instructions for processor 612, and a data storage device 607, such as a magnetic disk or optical disk and its corresponding disk drive. Mass storage device 607 is coupled to bus 611 for storing information and instructions.

Computer system 600 may further be coupled to a display device 621, such as a cathode ray tube (CRT) or liquid crystal display (LCD), coupled to bus 611 for displaying information to a computer user. An alphanumeric input device 622, including alphanumeric and other keys, may also be coupled to bus 611 for communicating information and command selections to processor 612. An additional user input device is cursor control 623, such as a mouse, trackball, track pad, stylus, or cursor direction keys, coupled to bus 611 for communicating direction information and command selections to processor 612, and for controlling cursor movement on display 621.

Another device that may be coupled to bus 611 is hard copy device 624, which may be used for printing instructions, data, or other information on a medium such as paper, film, or similar types of media. Furthermore, a sound recording and playback device, such as a speaker and/or microphone may optionally be coupled to bus 611 for audio interfacing with computer system 600. Another device that may be coupled to bus 611 is a wired/wireless telephony interface 625 to communicate with a telephone or handheld palm device over a wired or wireless network.

Note that any or all of the components and the associated hardware illustrated in FIG. 6 may be used in various embodiments of the computer system 600. However, it should be appreciated that other configurations of the computer system may include one or more additional devices not shown in FIG. 6. Furthermore, one should appreciate that the technique disclosed above is applicable to different types of system environment, such as a multi-drop environment or a point-to-point environment. Likewise, the disclosed technique is applicable to both mobile and desktop computing systems.

Some portions of the preceding detailed description have been presented in terms of symbolic representations of operations on data bits within a computer memory. These descriptions and representations are the tools used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations described herein. This apparatus may be specially constructed for the required purposes, or it may comprise a general-purpose computer selectively activated or reconfigured by a computer program stored in the computer. Such a computer program may be stored in a machine-accessible storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, embodiments of the present invention are not described with reference to any particular programming language. It will be appreciated that a variety of programming languages may be used to implement the teachings as described herein.

The foregoing discussion merely describes some exemplary embodiments of the present invention. One skilled in the art will readily recognize from such discussion, the accompanying drawings and the claims that various modifications can be made without departing from the spirit and scope of the subject matter.

What is claimed is:

1. An apparatus comprising:
   a resistor having a first end and a second end, the first end coupled to a voltage supply; and
   a ring oscillator sensor coupled between the second end of the resistor and ground, the ring oscillator sensor having an output coupled to a computational element,
   a ring oscillator,
   a counter having an input and an output, the input of the counter coupled to an output of the ring oscillator, and
   a sampler having an input and an output, the input of the sampler coupled to the output of the counter.

2. The apparatus of claim 1, wherein the computational element is a microcontroller.

3. The apparatus of claim 1, wherein the ring oscillator includes a plurality of inverters coupled to each other in series.

4. The apparatus of claim 1, wherein the counter includes a Gray counter and the ring oscillator sensor further comprises:
   a Gray-to-binary converter having an input and an output, the input of the Gray-to-binary converter coupled to an output of the sampler;
   a register having an input and an output, the input of the register coupled to the output of the Gray-to-binary converter; and
   a subtractor having a first input and a second input, the first input coupled to the output of the register and the second input coupled to the output of the Gray-to-binary converter.

5. The apparatus of claim 1, wherein an impedance of the ring oscillator sensor is nonlinear.

6. An apparatus comprising:
   a resistor having a first end and a second end, the first end coupled to a voltage supply; and
   a ring oscillator sensor coupled between the second end of the resistor and ground, the ring oscillator sensor having an output coupled to a computational element, wherein the ring oscillator sensor is operable to sense a voltage within a range of about one to twenty-five volts.

7. A method comprising:
   dividing an input voltage from a power source over a resistor and a ring oscillator sensor into a first voltage across the resistor and a second voltage across the ring oscillator sensor, the resistor and the ring oscillator sensor coupled in series; and
   sensing the second voltage using the ring oscillator sensor to generate a value substantially proportional to a square root of the input voltage minus a constant.

8. The method of claim 7, further comprising processing the value using a computational element coupled to the ring oscillator sensor.

9. The method of claim 8, wherein the computational element is a microcontroller.

10. The method of claim 7, wherein sensing the second voltage using the ring oscillator sensor comprises:
    inputting the second voltage into a power supply node of a ring oscillator in the ring oscillator sensor; and
    digitizing the second voltage using the ring oscillator sensor.

11. The method of claim 10, wherein digitizing the second voltage comprises:

creating a waveform having a frequency that varies in response to a change in the second voltage.

12. The method of claim 11, wherein digitizing the second voltage further comprises:
generating a digital signal based on the frequency using a counter and a sampler.

13. The method of claim 7, further comprising:
adjusting one or more control parameters of a point-of-load voltage regulator in response to the value; and
powering one or more processor cores using a voltage produced by the adjusted point-of-load voltage regulator.

14. A system comprising:
one or more memory devices;
a power delivery network coupled to the one or more memory devices to produce one or more voltage levels;
a voltage supply sensor coupled to the power delivery network, the voltage supply sensor including
a resistor having a first end and a second end, the first end coupled to a voltage supply, and
a ring oscillator sensor coupled between the second end of the resistor and ground, the ring oscillator sensor having an output coupled to a computational element;
a plurality of processor cores coupled to the voltage supply sensor and the one or more memory devices, the plurality of processor cores to be powered by an input voltage; and
one or more voltage regulating block coupled to the voltage supply sensor to regulate the input voltage in response to an output signal from the voltage supply sensor.

15. The system of claim 14, wherein the ring oscillator sensor and the plurality of processor cores reside on a common integrated circuit substrate.

16. A system comprising:
one or more memory devices;
a power delivery network coupled to the one or more memory devices to produce one or more voltage levels; and
a voltage supply sensor coupled to the power delivery network, the voltage supply sensor including
a resistor having a first end and a second end, the first end coupled to a voltage supply, and
a ring oscillator sensor coupled between the second end of the resistor and ground, the ring oscillator sensor having an output coupled to a computational element, wherein the ring oscillator sensor comprises:
a plurality of inverters coupled to each other in series;
a counter having an input and an output, the input of the counter coupled to an output of one of the plurality of inverters; and
a sampler having an input and an output, the input of the sampler coupled to the output of the counter.

17. The system of claim 14, further comprising the computational element to process an output signal from the ring oscillator sensor.

18. A machine-accessible medium that provides instructions that, when executed by a processor, will cause the machine to perform operations comprising:
dividing an input voltage from a power source over a resistor and a ring oscillator sensor into a first voltage across the resistor and a second voltage across the ring oscillator sensor, the resistor and the ring oscillator sensor coupled in series; and
sensing the second voltage using the ring oscillator sensor to generate a value substantially proportional to a square root of the input voltage minus a constant.

19. The machine-accessible medium of claim 18, wherein the operations further comprise processing the value using a computational element coupled to the ring oscillator sensor.

20. The machine-accessible medium of claim 18, wherein the operations further comprises:
inputting the second voltage into a power supply node of a ring oscillator in the ring oscillator sensor; and
digitizing the second voltage using the ring oscillator sensor.

21. The machine-accessible medium of claim 20, wherein digitizing the second voltage comprises creating a waveform having a frequency that varies in response to a change in the second voltage.

22. The machine-accessible medium of claim 21, wherein digitizing the second voltage further comprises generating a digital signal based on the frequency using a counter and a sampler.

23. The machine-accessible medium of claim 18, wherein the operations further comprise:
adjusting one or more control parameters of a point-of-load voltage regulator in response to the value; and
powering one or more processor cores using a voltage produced by the adjusted point-of-load voltage regulator.

* * * * *